United States Patent [19]
Verhoeven

[11] Patent Number: 5,233,315
[45] Date of Patent: Aug. 3, 1993

[54] COUPLED REGENERATIVE OSCILLATOR CIRCUIT

[75] Inventor: Christiaan J. M. Verhoeven, The Hague, Netherlands

[73] Assignee: Telefonaktiebolaget LM Ericsson, Hagersten, Sweden

[21] Appl. No.: 852,176

[22] PCT Filed: Oct. 15, 1990

[86] PCT No.: PCT/NL90/00154
§ 371 Date: Apr. 3, 1992
§ 102(e) Date: Apr. 3, 1992

[87] PCT Pub. No.: WO91/06151
PCT Pub. Date: May 2, 1991

[30] Foreign Application Priority Data

Oct. 16, 1989 [NL] Netherlands .................. 8902562

[51] Int. Cl.$^5$ .................. H03K 3/282; H03K 4/06
[52] U.S. Cl. .................. 331/45; 331/55; 331/113 R; 331/143
[58] Field of Search .................. 331/45, 46, 48, 55, 331/56, 111, 113 R, 143, 144, 145

[56] References Cited

U.S. PATENT DOCUMENTS 4,468,636  8/1984  Monticelli .................. 331/113 R
4,785,262  11/1988  Ryu et al. .................. 331/111

FOREIGN PATENT DOCUMENTS 0137368  4/1985  European Pat. Off. .
139060  12/1979  Fed. Rep. of Germany .

OTHER PUBLICATIONS

"One-chip oscillator generates in -quadrature waveforms", *Electronics*, vol. 51, No. 24, Nov. 23, 1978, by J. R. Pimentel, p. 147.

Primary Examiner—Siegfried H. Grimm
Attorney, Agent, or Firm—Young & Thompson

[57] ABSTRACT

Oscillator circuit of the regenerative type, comprising a first oscillator at least including a first feedback amplifier (Qa1, Qb1) and a first integrator (C1) in which the first oscillator has an output signal having two stable levels alternating in one oscillation cycle and an unstable or regenerative switching state between each of them, in which the loop gain is greater than unity, and has an input signal which originates from the integrator and which varies time-dependently in a positive or negative sense. A second oscillator identical to the first oscillator is provided which at least includes a second feedback amplifier (Qa2, Qb2) and a second integrator (C2) having an oscillation cycle which is equal to the said oscillation cycle or a multiple thereof and which is shifted with respect thereto. A first or second comparator (Qc1, Qd1, Qc2, Qd2) is provided which is associated with the first or second oscillator respectively and which detects the passage through zero, situated between two threshold levels, of the input signal of the associated first or second oscillator and derives therefrom a separate excitation signal for the second or first oscillator respectively.

3 Claims, 3 Drawing Sheets

COUPLED REGENERATIVE OSCILLATOR CIRCUIT

The invention relates to an oscillator circuit of the regenerative type, comprising a first oscillator at least including embodying a first feedback amplifier and a first integrator in which the first oscillator has an output signal having two stable levels alternating in one oscillation cycle and an unstable or regenerative switching state between each of them, in which the loop gain is greater than unity, and an input signal which originates from the integrator and which varies time-dependently in a positive or negative sense, a separate excitation signal being applied to the oscillator in order to fix the instant of switching.

Such an oscillator circuit is known from the article entitled "A new model for regenerative circuits" by C. J. M. Verhoeven in 30th Midwest Symposium on Circuits and Systems, Syracuse, N.Y., August 1987.

The simple oscillator of the regenerative type known from said article essentially comprises a feedback amplifier and an integrator. The output signal of such a regenerative oscillator has two extreme stable levels in the oscillation cycle thereof and an unstable switching state for a short time between each of them. In said unstable switching state, the loop gain is greater than unity and the amplifier operates with positive feedback or direct feedback. The amplifier configuration is such that in this case the output signal is in phase with the input signal. Said switching state involves regenerative operation and at the end of it, at least one of the components of the amplifier is in the blocked or saturated state. In this case, the loop gain is less than unity, with the result that the state can remain stable until the next switching instant. Such circuits are known in practice by different names, of which Schmitt trigger and flip-flop are the most well known. Characteristic of these circuits is that they exhibit a hysteresis and therefore have a memory action. The output signal is always in one of the two extreme states except during the very short switching time.

The integrator is used in the regenerative oscillator to generate precisely from a constant signal a time-dependent signal which varies in a positive or negative sense. In the case of an integrable regenerative oscillator, the integrator is usually a capacitor which integrates a constant current presented by the said amplifier. The amplifier has two threshold levels for the input or excitation signal originating from the integrator. If the input signal exceeds a threshold level associated with the present level of the output signal, the output signal will switch to the other stable signal level. The said current will change sign and the capacitor voltage will change in the opposite sense until the other threshold level is reached.

The switching of the current by the regenerative amplifier, in other words the instant at which the integrator voltage reaches the threshold level, will exhibit a certain uncertainty because both threshold level and integrator voltage have noise components. In addition, the oscillator will not change over immediately when the threshold level is reached since a certain time is necessary for changing over. The length of this time interval is again strongly affected by noise. As a consequence of said uncertainty, phase jitter occurs, and this results in undesirable energy components in the spectrum of the oscillator around the desired frequency. The relatively slowly changing integrator or capacitor voltage plays an unfavourable role in this connection since the excitation of the regenerative oscillator proves to be minimal as a result of this slow change.

In the said article, to reduce said phase jitter, it is proposed to increase the excitation, for example by injecting an additional excitation signal into the regenerative oscillator. Such an increase in excitation will improve the noise behaviour of the oscillator if the injected signal is always generated at the correct instant, i.e. with as little uncertainty in time as possible, and rapidly at full strength.

The object of the invention is to meet this requirement and provide an oscillator circuit of the regenerative type with which the separate excitation signal is obtained in accordance with the said requirements in an extremely effective manner.

In an oscillator circuit of the type specified in the preamble, this is achieved, according to the invention, in a manner such that a second oscillator identical to the first oscillator is provided which at least embodies a second feedback amplifier and a second integrator having an oscillation cycle which is equal to the said oscillation cycle or a multiple thereof and which is shifted with respect thereto, and that a first or second comparator is provided which is associated with the first or second oscillator respectively and which detects the passage through zero, situated between two threshold levels, of the input signal of the associated first or second oscillator and derives therefrom the separate excitation signal for the second or first oscillator respectively.

A further embodiment according to the invention has the characteristic that one or more oscillators identical to the first and second oscillator are additionally provided which each at least include a feedback amplifier and an integrator having an oscillation cycle which is equal to the said oscillation cycles and which is shifted with respect thereto, and that comparators which are associated with the one or more additional oscillators are provided which detect in each case the said passage through zero of the input signal of the associated oscillator and derive the separate excitation signal for the respectively next oscillator.

Certain passages through zero, in the case of an embodiment having two oscillators, the passage through zero, are detected precisely in the centre between the two threshold levels of the input signal with the aid of the comparator associated in each case with an oscillator. A rapid input or excitation signal which is injected into the other oscillator is generated thereby from the relatively slowly changing integrator voltage. An additional advantage of detecting said passage through zero in the case of the coupled oscillator according to the invention is the fact that the integrator voltage normally continues to change slowly during the detection of said passage through zero by the comparator. In the regenerative oscillator circuit comprising a simple oscillator, the reaching of a threshold level by the input voltage has the consequence that the integrator or capacitor voltage again departs from the threshold level since the regenerative circuit changes over. The result is that the detection counteracts, as it were, itself since the capacitor voltage will not go further above the threshold level than is precisely necessary in order to initiate the regenerative switching state. This implies that the simple regenerative oscillator is excited only in a minimum way.

From the article entitled "One-chip oscillator generates inquadrature waveforms" by J. R. Pimentel from Electronics, Volume 51, No. 24, Nov. 23, 1978 a circuit is known with which signals can be generated which are in quadrature, the so-called two-integrator oscillators. This circuit is, however, essentially different from the circuit according to the invention described here. It does not comprise, in particular, two coupled oscillators, but two coupled integrators. Said integrators cannot themselves act as independent oscillators. It is consequently not possible to generate two different frequencies, the highest frequency being a whole multiple of the lowest, while the phase relationship continues to be maintained. In the present circuit described this is in fact the case. The coupling of more than two oscillators, which yields an increased frequency stability, does not have a comparable equivalent in the case of the two-integrator oscillator either.

The coupling of regenerative oscillators has been discussed per se in the literature. An example of this is to be found in DD-139,060. Only one of the two oscillators is active at any time. The active oscillator disables the other oscillator and only releases it if it enters the passive state itself. The timing in said circuit thus always depends on one of the two oscillators. This means that the timing does not differ fundamentally from the timing in a single oscillator. Although signals with equal frequency and differing phase can be generated, the frequency stability is not improved by this way of coupling. In the coupled circuit of the invention, both oscillators are always active, as a result of which the fundamentally different timing principle described here can be implemented. An improvement of the frequency stability is therefore actually achieved in this case.

The invention will be explained in more detail on the basis of some exemplary embodiments with reference to the drawings, in which.

Figure 1:
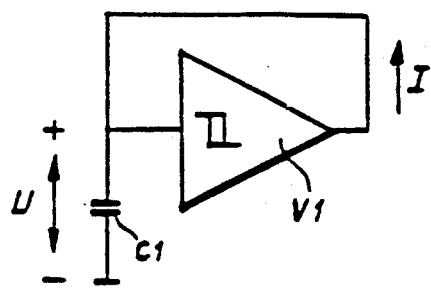
FIG. 1 shows a simple circuit diagram of a simple oscillator circuit of the regenerative type from the prior art.
Figure 2:
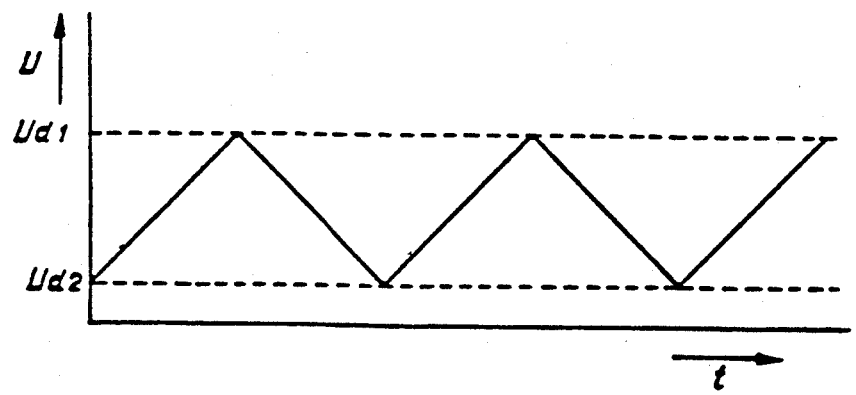
FIG. 2 shows a graph of the input signal, delivered by the integrator from FIG. 1, for the amplifier with associated threshold levels.

The known oscillator circuit of the regenerative type shown in FIG. 1 comprises a feedback amplifier V1 and an integrator formed by a capacitor C1. The input voltage U of the integrator which is shown in FIG. 2 and forms the input voltage of the amplifier will slowly increase and decrease depending on the sense of the current I. When the capacitor voltage U reaches the threshold voltage $U_{d1}$ or $U_{d2}$ associated with the existing current sense, the sign of the current will change. The capacitor voltage will again change in the other sense until the second threshold level $U_{d2}$ or $U_{d1}$ is reached, etc. In this known circuit, an appreciable phase jitter occurs as a consequence of the reasons stated earlier.

Figure 3:
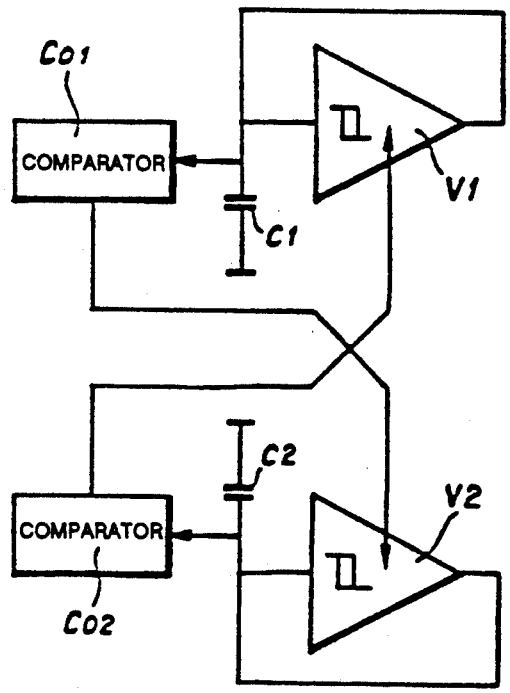
FIG. 3 shows the circuit diagram of the coupled oscillator circuit according to the invention.

In the circuit according to the invention shown in FIG. 3, a second oscillator V2 is provided which is identical to the first (V1) and which has the same oscillation cycle or a multiple thereof. The comparator Co1, Co2 associated with each oscillator V1, V2 detects the passage through zero, situated in the centre between the two threshold levels, of the relatively slowly changing integrator voltage and derives therefrom a fast excitation signal for the other oscillator V2, V1. Since this additional excitation signal injected into each oscillator is derived from the other oscillator at the correct instant with as little uncertainty as possible and at maximum amplitude, the noise behaviour of the oscillator is appreciably improved. For each separate oscillator, this improvement may amount to more than 6 dB, which can be achieved as a maximum by coupling two harmonic oscillators. As already stated, the advantage also arises that the capacitor voltage continues its time-dependent variation after the change-over.

A further advantage, according to the invention, in the case of this coupled oscillator is as follows. In the simple regenerative oscillator, the unstable or regenerative switching state is produced because a threshold level is detected by the input signal. In an emitter-coupled oscillator, for example, this means that one of the two transistors of the differential pair conducts virtually all the current and the other conducts virtually no current. In the expression for the maximum loop gain, and therefore for the threshold voltages, the temperature very often occurs if special measures are not taken. The consequence of this is that the frequency of the simple oscillator is affected by the temperature. In the mutually coupled oscillator according to the invention, the effect of the regenerative section on the temperature behaviour is eliminated since the comparators now determine the switching or change-over. As a result, the drift of the coupled oscillator is less than in the case of a simple regenerative oscillator.

In many applications, the linearity of an oscillator is of importance if it is used as voltage-controlled oscillator (VCO) or current-controlled oscillator (CCO). In the case of the simple regenerative oscillator, the regenerative circuit usually causes nonlinearity because the controlling signal also affects the location of the threshold levels. In the coupled oscillator, the comparators determine the change-over instant so that this form of nonlinearity is excluded. In addition, the coupled embodiment produces a second modulation possibility: the injection current can be varied. In this case there is a linear relationship between the cycle time and the controlling signal. The linearity of the coupled oscillator is therefore better than that of a simple oscillator. Oscillators which make use of a resonator such as a crystal or LC network are tuned by influencing a parameter of the resonator. The relationship between this parameter and the frequency generated is generally fundamentally nonlinear. In addition, the frequency cannot be changed instantaneously because the change in the parameter of the resonator also means that the energy stored in the resonator changes. This energy content cannot be changed instantaneously. In regenerative oscillators, the frequency can be changed by, for example, changing a current, and this does make possible instantaneous changes in the frequency.

Figure 4:
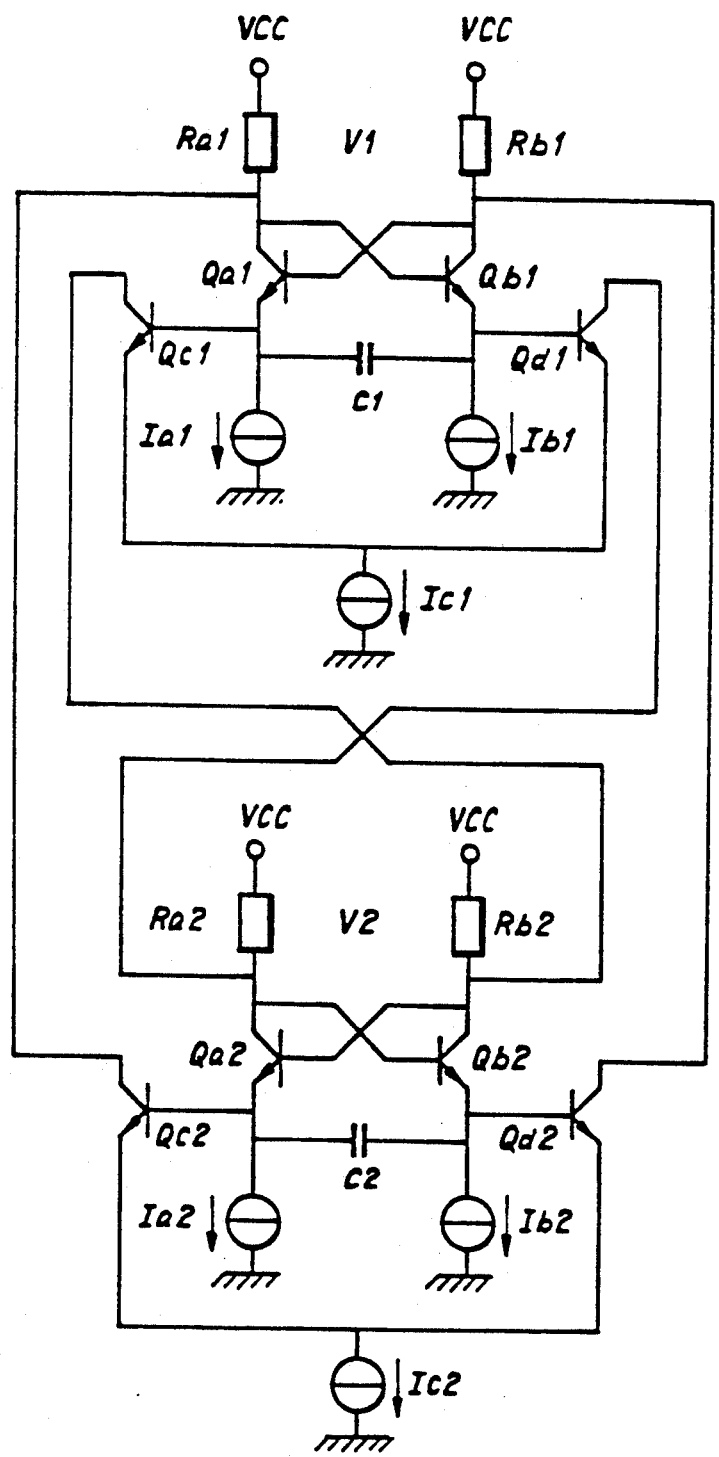
FIG. 4 shows a diagram of an embodiment according to the invention.

The embodiment shown in FIG. 4 contains two emitter-coupled oscillators V1; V2 which are each composed of a regenerative circuit formed by the differential transistor pair $Q_{a1}$, $Q_{b1}$; $Q_{a2}$, $Q_{b2}$ and the integrator formed by the capacitor C1; C2. The current sources $I_a$ and $I_b$ are used to adjust the oscillator. Depending on the state of the regenerative circuit, $I_a$ or $I_b$ will flow through the capacitor. Furthermore, a comparator $Q_{c1}$, $Q_{d1}$; $Q_{c2}$; $Q_{d2}$ is provided for each oscillator V1; V2. The passage through zero of the integrator voltage is always detected by each comparator. Depending on the voltage difference between the bases of $Q_c$ and $Q_d$, the bias current $I_c$ will flow through $Q_c$ or $Q_d$. As a consequence of this an additional voltage is produced across one of the two load resistors $R_a$ or $R_b$. This results in a shift in the threshold voltage of the respective regenerative circuit. This shift is linearly dependent on the bias current $I_c$ of the injecting comparator. Because the cycle time generated is again linearly dependent on the difference between the two threshold levels, the currents $I_c$ can be used to apply the circuit as a very linear current-controlled oscillator.

Figure 5:
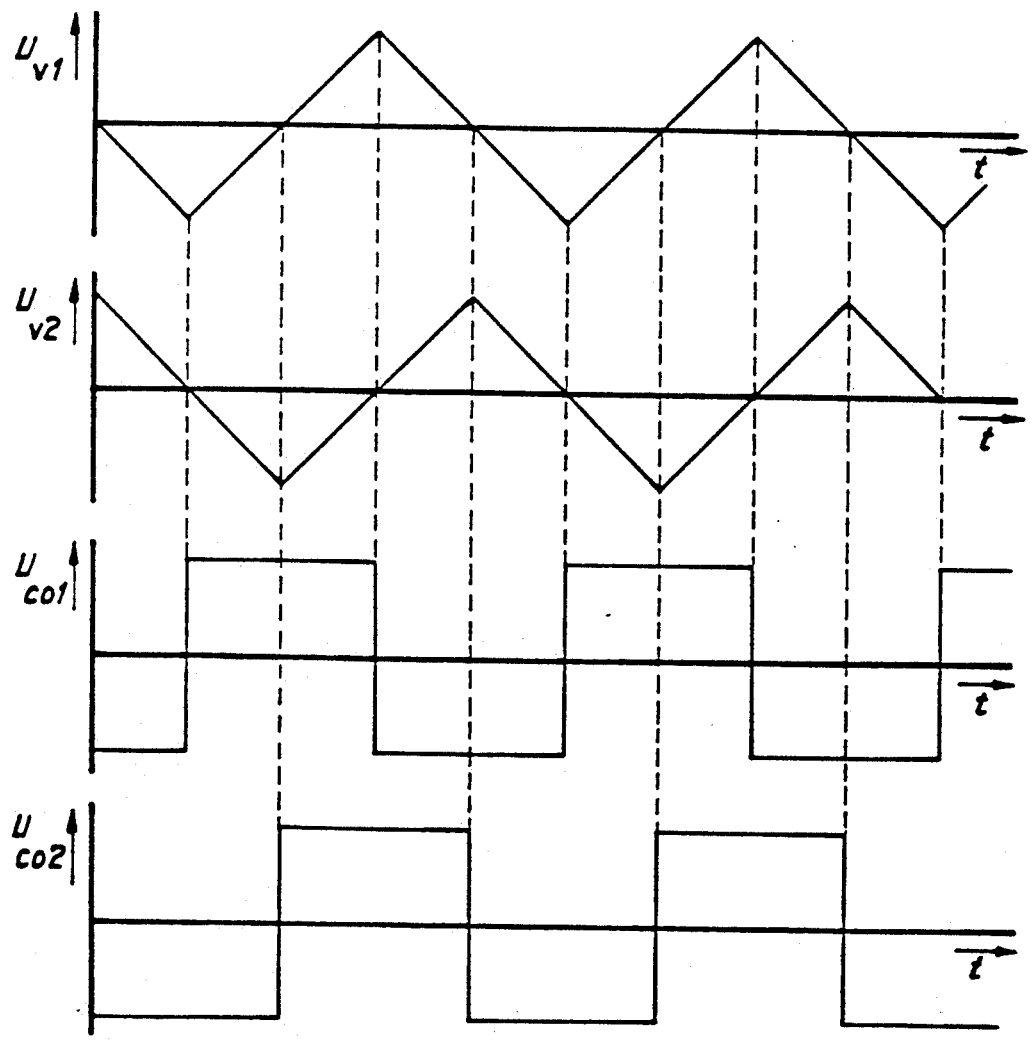
FIG. 5 shows a graph of the input and output voltages associated with the oscillator circuit of FIG. 4.

Since the coupled oscillator circuit embodying two oscillators is completely symmetrical, the passages through zero of the capacitor voltages of the two oscillators will be shifted precisely through 90° with respect to each other. That is to say that there are two identical output signals—one from each oscillator—which differ mutually by exactly 90° in phase, i.e. are in quadrature, as is shown in FIG. 5. This phase relationship is very rigidly maintained by the coupled oscillator. If the natural frequencies of the two oscillators are not equal, for example because the capacitors have a different value, one frequency will nevertheless be generated in the coupled oscillator circuit and this is the mean of the two natural frequencies. The phase relationship then nevertheless remains 90°. In the case of very large frequency differences, the oscillators will produce frequencies which are an even multiple of each other; for example, $f_1:f_2 = 1:4$. However, more than two oscillators may also be provided, as a result of which other phase relationships are possible, the favourable properties mentioned being retained.

The availability of output signals accurately shifted in phase is, in particular, of great importance in many applications. Often these mutual relationships are achieved in oscillators which operate at higher frequency, after which signals having the desired phase and frequency are produced by means of frequency dividers. The coupled oscillator does not have the great disadvantage that the oscillator has to operate at a higher frequency than is actually necessary at the output. That is to say, the coupled oscillator only needs to work at half the frequency at which the oscillator which drives the dividers would have to work. With a given technology, generation with the aid of a regenerative oscillator of double the frequency can entail problems, while generation of the frequency itself is in fact possible. The use of the coupled oscillator is then a practical solution.

A great advantage of the regenerative oscillator circuit according to the invention is furthermore that all the components can be integrated. This is in contrast to most harmonic oscillators which comprise a resonator such as a crystal or an LC network. Such a resonator is virtually never completely capable of integration. In the case of a LC resonator, the coil cannot usually be integrated. The "simulation" of such a coil with the aid of a gyrator and a capacitor, however, entails the problem that the gyrator-capacitor combination produces noise, while a "real" coil does not do so. Regenerative oscillators are completely capable of integration.

The coupled oscillator described can be used advantageously in some applications, for example as a local oscillator in a completely integrated radio receiver. The availability of quadrature signals then makes all kinds of detection methods possible. The coupled oscillator can be used as a linear FM modulator, for example as a linear converter of a base band video signal into an FM-modulated signal for transmitting video images via a glass fiber. The coupled oscillator can also be used as a voltage-controlled oscillator in a phase-locked loop (PLL) in which the availability of quadrature signals is a great advantage.

To summarize, the following properties or advantages are in brief of importance: the coupled oscillator produces less phase noise, has a better linearity and less drift than in the case of the simple regenerative oscillator. Furthermore, in the case of the coupled oscillator, quadrature signals are available "by nature", as a result of which dividers etc. are unnecessary, and the coupled oscillator is completely capable of integration. The circuit does not per se have to be produced with bipolar components, but can also be implemented in another IC technology, for example an MOS process.

I claim:

1. Oscillator circuit of the regenerative type, comprising a first oscillator at least including a first feedback amplifier and a first integrator in which the first oscillator has an output signal having two stable levels alternating in one oscillation cycle and an unstable or regenerative switching state between each of them, in which the loop gain is greater than unity, and an input signal which originates from the integrator and which varies time-dependently in a positive or negative sense, a separate excitation signal being applied to the oscillator in order to fix the instant of switching, characterized in that a second oscillator identical to the first oscillator is provided which at least includes a second feedback amplifier and a second integrator having an oscillation cycle which is equal to the said oscillation cycle or a multiple thereof and which is shifted with respect thereto, and in that first and second comparators are provided which are associated with the first and second oscillators respectively and which detect the passage through zero, situated between two threshold levels, of the input signal of the associated first or second oscillator and derive therefrom the separate excitation signal for the second or first oscillator respectively.

2. Oscillator circuit of the regenerative type according to claim 1, characterized in that one or more oscillators identical to the first and second oscillator are additionally provided which each at least include a feedback amplifier and an integrator having an oscillation cycle which is equal to the said oscillation cycles and which is shifted with respect thereto, and in that comparators associated with the one or more additional oscillators are provided which detect in each case the said passage through zero of the input signal of the associated oscillator and derive therefrom the separate excitation signal for the respectively next oscillator.

3. Oscillator circuit of the regenerative type according to claim 1, characterized in that, in the oscillators, the amplifier is composed of a differential pair of emitter-coupled transistors, the integrator is formed by a capacitor, and the comparator is composed of a differential pair of emitter-coupled transistors.

* * * * *